United States Patent
Lundy et al.

(10) Patent No.: US 6,887,654 B2
(45) Date of Patent: May 3, 2005

(54) RESIDUE AND SCUM REDUCING COMPOSITION AND METHOD

(75) Inventors: Daniel E. Lundy, Winchendon, MA (US); Robert K. Barr, Shrewsbury, MA (US); Edgardo Anzures, Westborough, MA (US); Edward J. Brady, Pepperell, MA (US); James G. Shelnut, Northboro, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 64 days.

(21) Appl. No.: 10/431,002

(22) Filed: May 7, 2003

(65) Prior Publication Data

US 2003/0215755 A1 Nov. 20, 2003

Related U.S. Application Data

(60) Provisional application No. 60/378,625, filed on May 7, 2002.

(51) Int. Cl.⁷ .............................. G03F 7/32; G03F 7/42; C23G 1/02; C25F 1/00

(52) U.S. Cl. ..................... 430/329; 430/325; 430/326; 430/331; 134/1.3; 134/2; 510/175; 510/176

(58) Field of Search .................................. 430/331, 329, 430/325, 326; 510/175, 176; 134/1.3, 2, 1.2, 3

(56) References Cited

U.S. PATENT DOCUMENTS

| 4,820,621 A | * | 4/1989 | Tanka et al. ................. 430/331 |
| 5,922,522 A | * | 7/1999 | Barr et al. .................... 430/493 |
| 6,063,550 A | * | 5/2000 | Lundy et al. ................ 430/331 |
| 6,248,506 B1 | * | 6/2001 | Lundy et al. ................ 430/329 |
| 2003/0099909 A1 | * | 5/2003 | Takamiya .................... 430/331 |

* cited by examiner

*Primary Examiner*—Richard L. Schilling
(74) *Attorney, Agent, or Firm*—John J. Piskorski

(57) ABSTRACT

A composition and method to reduce or to prevent residue and scum formation on a substrate or in a solution. The composition contains an aromatic alkoxylate in combination with a polyol or ether or ester of a polyol. The composition also reduces or prevents foam formation such as in developing processes in the manufacturing of printed wiring boards.

10 Claims, No Drawings

RESIDUE AND SCUM REDUCING COMPOSITION AND METHOD

This application claims the benefit of U.S. Provisional Application(s) No(s).: Application No.(s).: 60/378,625 Filing Date May 7, 2002.

BACKGROUND OF THE INVENTION

The present invention is directed to a composition and method for reducing or preventing formation of organic residue and scum derived from photolithographic compositions from a substrate or a solution. More specifically, the present invention is directed to a composition and method for reducing or preventing the formation of organic residue and scum derived from photolithographic compositions from a substrate or a solution where the composition contains an aromatic alkoxylate in combination with a polyol.

Contaminants such as built-up organic residue and scum from photolithographic compositions present difficult cleaning problems for the electronics industry. Photolithographic residue and scum such as from photoresist developer solutions, stripper solutions and the like can build-up on various products and apparatus. Photoresist materials are employed in the manufacturing of semiconductor devices, and electronic components such as integrated circuits, photomasks for the manufacturing of integrated circuits, printed wiring boards and the like as well as planographic printing plates. In photolithographic processing, a substrate surface is coated with a photoresist, i.e., a coating composition that is sensitive to actinic radiation, e.g., ultraviolet light, X-rays, electron beams and the like, to give a layer that is sensitive to actinic radiation which is irradiated pattern-wise with the actinic radiation. The irradiated photoresist is then developed with a developer solution to form a patterned photoresist layer that serves to selectively protect the substrate surface from etching, plating or diffusion of dopants.

Photoresists may be positive-working, or negative-working. Such photoresists may be liquid, or dry film. A photoresist composition of the positive-working type has such a photosensitivity that solubility of the composition in the developer solution is increased by exposure to light so that the patterned photoresist layer is formed on the areas unexposed to ultraviolet light where the composition is left undissolved. A negative-working photoresist composition exhibits behavior of a sensitivity and solubility that is the reverse of the positive-working photoresist.

Along with recent progress in the technology of semiconductor devices with a requirement for finer and finer high-fidelity patterning of a line width of 1 micron or even finer to comply with the trend of increased density of integration in semiconductor devices, photolithographic processes of patterning using a positive-working photoresist also envisages a difficult problem. When patterning is desired of an extremely fine contact hole in a fine pattern, alkaline developer solution is admixed with a surface active agent with an object to increase the wettability of the substrate surface with the aqueous developer solution. One of the problems in the addition of a surface active agent to the developer solution, is that film residues and scums sometimes occur on the exposed areas where the photoresist layer is desirably dissolved away as completely and cleanly as possible. Although the film residues and scums can be removed by gently treating the surface with oxygen plasma or sputtering, no complete solution to the problem can be obtained by such methods because such treatments must be performed under well controlled troublesome conditions, and is not efficient in respect of smooth removal of the scums, or gives no uniform effect of treatment in finely patterned areas having contact holes of about 1 micron or smaller in diameter.

U.S. Pat. No. 4,820,621 to Tanaka et al. has addressed the problem of residue and scum formation by modifying a developer solution with the addition of a non-ionic surface active agent that is a polyoxyethylene alkyl-substituted phenyl ether. The ether is included in the developer solution in an amount of from 50 to 5000 ppm (parts per million). The developer solution is employed in patterning using a positive-working photoresist composition composed of an alkali-soluble novolac resin and a naphthoquinone diazide compound. The '621 patent alleges that patterning the positive photoresist with the developer containing the polyoxyethylene alkyl-substituted phenyl ether prevents formation of residues and scums after development.

Similar residue and scum formation also occur when negative-working photoresists are employed. For example, in manufacturing printed circuit boards UV curable negative-working photoresists may be used. Exposed portions of the photoresist become insoluble in alkaline developer solution and form a protective barrier to other processing chemicals such as etching and plating solutions. Unexposed portions of the photoresist are to rinse freely from the circuit board with an alkaline solution such as a 1% sodium carbonate, monohydrate in water. Development occurs because polymers in the photoresist contain acid functionality. Such acid functionality within the polymers are neutralized in alkaline solution forming a water soluble organic salt. As the dissolved photoresist builds up in solution (developer loading), insoluble organic materials, such as uncured photoresist, begin to form in the developing tank eventually forming a water insoluble residue or scum. Presence of anti-foam additives (conventionally added to developing solutions to minimize foaming) greatly increases the tendency for residue and scum to form. As the level of scum builds, chances increase for an inadvertent redeposit of these water insoluble residues onto the developed circuit board. Such redeposited residues cause a retardation of the etching solution (etching chemistries have difficulty penetrating any organic residues). Where etch is retarded, circuit shorts form causing a defective circuit board. In addition to increasing the potential for defective circuit boards, the residue also makes cleaning equipment difficult, thus increasing maintenance time. Such residue and scum can adhere to developer apparatus surfaces, plug nozzles, and redeposit onto surfaces of printed wiring boards causing defects in the boards.

In addition to the problem of built-up residue and scum formation from primary photoresists, there also is a residue and scum build-up problem from secondary photoresists. Such secondary photoresists may be employed in soldermasks. Residue and scum are deposited on a substrate as a result of component separation in the soldermask. Such component separation may be exacerbated when an improperly balanced soldermask developer solution, i.e., improper developing conditions and/or soldermask developer solution chemistry, contact the soldermask. Built-up residue and scum from secondary photoresists often appear as a bright green coating on a substrate such as a developer apparatus.

Cleaners used to remove residue and scum may vary in composition. Typically, cleaners include as active ingredients a strong base such as sodium hydroxide, and chelating agents such as ethylene diamine tetraacetate (EDTA). Surfactants, solvents and emulsifying agents may also be included in the cleaners. Cleaners are employed at temperature ranges from about 45° C. to about 55° C. Many cleaners are primarily used because of the low cost of their ingredients. However, workers in the field using such cleaners have discovered that the residue problem is often made worse. Often the equipment has to be manually cleaned to remove the residue from the photoresist as well as from the cleaners. Such manual cleaning is both a labor and time intensive operation that can cause a significant loss of production time. Further, many cleaners are not effective enough for removing residue and scum from new generation photoresists that have many hydrophobic aromatic materials.

U.S. Pat. No. 5,922,522 to Barr et al.; U.S. Pat. No. 6,063,550 to Lundy et al.; and U.S. Pat. No. 6,248,506 B1 to Lundy et al. disclose surfactant and surfactant mixtures added to developer solutions that prevent or inhibit the formation of residues and scum on circuit boards and circuit board manufacturing equipment. Such surfactants are composed of a hydrophobic group, an alkoxylated hydrophilic group and a nonionic or anionic capping group. Examples of suitable hydrophobic groups include nonylphenol, octylphenol and tristyrylphenol. Examples of suitable alkoxylated hydrophilic groups include ethylene oxide, propylene oxide and ethylene oxide/propylene oxide groups. Examples of suitable capping groups include hydroxyl, carboxyl, sulfonyl, phosphonyl, or mixtures thereof. Such residue and scum reducing compounds are included in developer solutions in amounts of from about 0.05% to about 1.0% by weight.

Although the developer solutions disclosed in U.S. Pat. No. 5,922,522; U.S. Pat. No. 6,063,550; and U.S. Pat. No. 6,248,506 B1 provide an effective means of reducing the amount of build-up of residue and scum on substrates containing photoresist, such as circuit boards, and equipment used in the manufacture of electronic components, there is still a need for an improved composition and method for reducing or preventing formation of residue and scum on various substrates such as developer apparatus as well as developer solutions. Regardless of the efforts to prevent build-up of residue and scum in developer apparatus, such as a conventional spin developer, or a spray developer where developer solution is sprayed onto a substrate surface, repeated use of such apparatus inevitably results in the build-up of residue and scum. At a certain point, the residues and scum accumulate to such an extent that the equipment is shut down for cleaning, thus reducing product output. Such residue and scum may include hydrophobic aromatic materials such as photoinitiators, dyes, (meth)acrylic monomers and other organic materials that make up photoresists as well as antifoam agents and surfactants. Such built-up residue and scum are often difficult to re-emulsify with many developer apparatus cleaners.

In addition to residue and scum formation, excessive foaming is another problem. When photoresist is removed from a substrate with a developer solution, foaming occurs. Excessive foaming during photoresist removal may cause developer solution levels to go below their effective minimum threshold levels. Such a condition results in developer equipment shutdown and reduced product out-put. Foaming may also obscure a workers field of view during manufacturing of printed wiring boards making it difficult to determine photoresist break points, and to monitor printed wiring board panels in developing chambers resulting in printed wiring board defects. Additionally, cleaning equipment that contains large amounts of foam is difficult. Rinsing a foam contaminated apparatus with water aggravates foam formation.

Accordingly, there is a need for a composition and method that reduces or prevents residue and scum formation from photolithographic compositions as well as reducing or preventing foam formation during development of photoresist.

SUMMARY OF THE INVENTION

The present invention is directed to a composition composed of an aromatic alkoxylate in combination with a polyol in sufficient amounts to reduce or prevent residue and scum formation derived from photolithographic compositions.

Advantageously, the composition of the present invention which contains an aromatic alkoxylate in combination with a polyol reduces or prevents residue and scum derived from photolithographic compositions such as organic residues deposited by both positive-working and negative-working photoresist from a substrate. Such substrates include, but are not limited to, developer apparatus used in applying developer solution to a photoresist as well as other apparatus used in the manufacture of printed wiring boards, and the printed wiring boards themselves. Examples of developer apparatus include, but are not limited to, spray developers where developer is sprayed onto a photoresist, or conventional spin developers, immersion developers, or a batch or feed-and-bleed operation apparatus, and the like. Additionally, the composition of the present invention also reduces or prevents residue and scum from forming in developer solutions during development of photoresist.

Continuous or prolonged use of equipment employed in applying photoresist or that contacts photoresist during the manufacture of photolithographic devices such as printed wiring boards results in the build-up of undesirable residue on the equipment. The built-up residue may block or clog lines or movable parts on the equipment resulting in production shutdown. Additionally, the residue build-up on printed wiring boards causes defects in the boards such as electrical shorts. Cleaning done with cleaners is not always effective because residue and scum contain chemicals that are difficult to re-emulsify. Cleaning, within the scope of the present invention, means removing built-up residue and scum from a substrate, such as by re-emulsification Also, cleaners may further contaminate the equipment and manufactured articles by depositing difficult to remove antifoam agents and surfactants. The compositions of the present invention eliminate cleaning or at least reduce the difficulty of cleaning built-up residue and scum from a substrate. Residues and scum that form on substrates or in solutions treated with compositions of the present invention are easier to re-emulsify with cleaners, thus improving the cleaning process.

Another problem that the compositions of the present invention solve is foaming. When photoresist is removed from a substrate with a developer solution, foaming often occurs. Excessive foaming during photoresist removal may cause developer solutions to go below their effective minimum levels. Such a condition results in developer equipment shutdown and reduced product out put. Foaming may also obscure a workers field of view during manufacturing of printed wiring boards making it difficult to determine photoresist break points, and to monitor printed wiring board panels in developing chambers resulting in defective printed wiring boards and inefficient manufacturing processes. By the addition of anti-foaming agents compatible with aromatic alkoxylates and polyols, the compositions of the present invention also reduce or prevent foaming.

By adding the compositions of the present invention to developer solutions, both foaming and residue formation can be reduced or prevented during printed wiring board manufacturing processes without any reduction in developer performance. Accordingly, the present invention also is directed to developer compositions and to a method of developing photoresist.

A primary objective of the present invention is to provide for an improved residue and scum reducing composition.

Another objective of the present invention is to provide for an improved antifoam composition.

A further objective of the present invention is to provide for a composition that reduces or inhibits residue and scum formation caused by positive-working and negative working photoresist.

An additional objective of the present invention is to provide for an improved developer solution.

Still yet, an additional objective of the present invention is to provide for an improved method of developing photoresist.

Other advantages may be ascertained by a person of skill in the art reading the following description of the invention and the appended claims.

DETAILED DESCRIPTION OF THE INVENTION

The composition of the present invention is composed of an aromatic alkoxylate in combination with a polyol to reduce or prevent formation of residue and scum caused by photolithographic compositions.

Aromatic alkoxylates within the scope of the present invention include, but are not limited to, compounds having the following formula:

RO(C_nH_{2n}O)_xH  (I)

where R is phenyl, mono-, di, or tri-substituted phenyl, a phenyl ($C_1$–$C_6$)alkyl, a mono-, di-, or tri-substituted phenyl ($C_1$–$C_6$)alkyl where the phenyl substituent group(s) each have a total of 1 to 30 carbon atoms, and where each substitution can be a saturated or unsaturated straight or branched carbon, a phenyl, an alkyl phenyl, a phenyl alkyl or an alkyl phenyl alkyl group, where n is an integer of from 2 to 4 and may be the same or different for each alkylene oxide unit, and where x is from 2 to 100.

Salts of the foregoing aromatic alkoxides also may be employed. Suitable salts include, but are not limited to, sulfate and phosphate salts, including esters thereof, such as metal salts, such as alkali metal or alkaline earth metal salts, for example sodium, potassium, calcium or magnesium salts, or salts of ammonia or an organic amine, such as morpholine, piperidine, pyrrolidine, a mono-, di-, or tri-hydroxy-lower alkylamine, for example mono-, di-, or tri-ethanolamine.

Illustrative R groups include nonylphenyl, octylphenyl, monostyrylphenyl, distyrylphenyl and tristyrylphenyl with tristyrylphenyl a preferred R group. Illustrative of suitable alkylene oxide units include ethylene oxide and propylene oxide. Alkylene oxide units within the scope of the present invention also may be a radical —CH$_2$—CH(—CH$_3$)—O—CH$_2$—CH$_2$—, or —CH$_2$—CH$_2$—CH$_2$—O—CH$_2$—CH$_2$— such that the alkylene oxide unit is a mixture of ethylene and propylene oxide units.

A particularly preferred tristyrylphenol alkoxylate is a tristyrylphenol ethoxylate having the general formula:

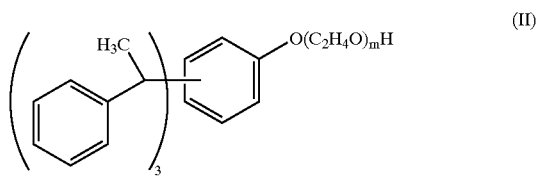

(II)

where m is an integer of from 8 to 40, preferably from 10 to 20 and most preferably from 14 to 18. Salts of the tristyrylphenol ethoxylate also may be employed such as the sulfate or phosphate, including esters thereof, for example, metal salts, such as alkali metal or alkaline earth metal salts, for example sodium, potassium, calcium, or magnesium salts or salts with ammonia or an organic amine, such as morphiline, piperidine, pyrrolidine, a mono-, di-, or tri-hydroxy-lower alkylamine, for example mono, di, or tri-ethanolamine.

Illustrative of suitable tristyrylphenol ethoxylates that may be used to practice the present invention include tristyrylphenol ethoxylate (8 moles of ethylene oxide), tristyrylphenol ethoxylate (16 moles of ethylene oxide), tristyrylphenol ethoxylate (20 moles of ethylene oxide), tristyrylphenol ethoxylate (25 moles of ethylene oxide), tristyrylphenol ethoxylate (40 moles of ethylene oxide), tristyrylphenol ethoxylate/propoxylate, tristyrylphenol ethoxylate phosphate ester (free acid), tristyrylphenol ethoxylate phosphate ester (potassium salt), and ammonium tristytrylphenol ethoxy sulfate. Such compounds may be prepared by known methods in the art, or obtained commercially under the trade name product Soprophor® (obtainable from Rhodia). Examples of commercially available Soprophor® include Soprophor® BSU where m=16, and Soprophor® S/40-P where m=40. U.S. Pat. Nos. 5,463,101 and 5,874,495 disclose methods of preparing tristyrylphenols, the entire disclosures of which are incorporated herein by reference.

Polyols within the scope of the present invention include polyols that reduce or prevent residue and scum formation or at least reduce foaming such polyols include linear and cyclic polyols including esters and ethers thereof. A wide variety of polyols are useful in the present invention and can include, without limitation, diols (e.g. ethylene glycol, propylene glycol, etc.), triols (e.g. glycerol, butanetriol, etc.), tetraols (e.g. erythritol, threitol, pentaerythritol, etc.), pentaols (e.g. xylitol, arabitol, ribitol, etc.), hexaols (e.g. sorbitols, mannitol, galactitol, etc.), aldo- or keto-triose, -tetrose, -pentaose, -hexose, -heptose, etc. (e.g. glyceraldehyde, erythrose, threose, ribose, arabinose, fructose, sorbose, glucose, galactose, mannose), di-, tri-, oligo- or polysaccharides, such as sucrose, cellobiose, isomaltose, maltose, maltotriose, starch, cellulose, hemicellulose, and the like. Additionally, non-reducing sugars derived from mono-, di-, tri-, oligo- or polysaccharides, e.g. alkyl glycosides like methyl-glycoside, other sugars such as trehalose, isotrehalose, raffinose, stachyose, etc.) can also be used. Other useful polyols include aldonic acid, aldonic acid salts (e.g. methyl gluconate, sodium gluconate, etc.), aldonic lactones (e.g. gluconolactone, etc.), aldaric acid esters or salts (e.g. dimethyltartarate, diamonium tartarate, etc.). Also, mixtures of any of the above polyols may be used. The polyols that are useful in the present invention can also include polyols which have been reacted with ethylene oxide or other alkylene oxides to provide alkoxylated polyols. Also included are ethers and esters of polyols.

Polyols such as glycoside and polyglycoside compounds including alkoxylated glycosides may be used. A useful polyglycoside is one according to the formula:

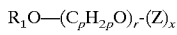

$$R_1O\text{—}(C_pH_{2p}O)_r\text{-}(Z)_x \quad (III)$$

where Z is derived from glucose, $R_1$ is a hydrophobic group selected from alkyl groups, alkylphenyl groups, hydroxyalkylphenyl groups as well as mixtures thereof, wherein the alkyl groups may be straight chained or branched, which contain from 8 to 18 carbon atoms, p is 2 or 3, r is an integer from 0 to 10, and x is a value from 1 to 8.

A further alkyl glycoside suitable for use in the practice of the present invention may be represented by the formula below:

$$R_2O\text{—}(R_3O)_y\text{-}(G)_xZ_b \quad (IV)$$

where $R_2$ is a monovalent organic radical containing from 6 to 30, preferably from 8 to 18 carbon atoms; $R_3$ is a divalent hydrocarbon radical containing from 2 to 4 carbon atoms; O is an oxygen atom; y is an integer from 0 to 1; G is a moiety derived from a reducing saccharide containing 5 or 6 carbon atoms; and x is an integer from 1 to 5; Z is $O_2 M^1$,

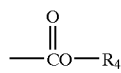

(V)

$O(CH_2)$, $CO_2M^1$, $OSO_3M^1$, or $O(CH_2)SO_3M^1$; $R_4$ is $(CH_2)$ $CO_2M^1$ or $CH=CHCO_2M^1$; (with the proviso that Z can be $O_2M^1$ only if Z is in place of a primary hydroxyl group in which the primary hydroxyl-bearing carbon atom, $-CH_2OH$, is oxidized to form a

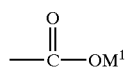

(VI)

group); b is a number of from 0 to 3k+1 preferably an average of from 0.5 to 2 per glycosal group; k is an integer of from 1 to 10; $M^1$ is $H^+$ or an organic or inorganic counterion, particularly cations such as, for example, an alkali metal cation, ammonium cation, monoethanolamine cation, or calcium cation.

Examples of such alkylglycosides as described above include, but are not limited to, APG™ 325 CS Glycoside® which is described as being a 50% $C_9$–$C_{11}$ alkyl polyglycoside, also commonly referred to as D-glucopyranoside, (commercially available from Henkel Corp, Ambler Pa.) and Glucopon™ 625 CS which is described as being a 50% $C_{10}$–$C_{16}$ alkyl polyglycoside, also commonly referred to as a D-glucopyranoside, (available from Henkel Corp., Ambler Pa.).

Exemplary alkyl glycosides suitable for use in the practice of this invention include those represented by the formula:

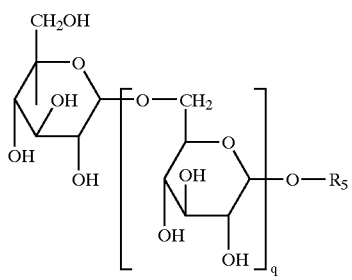

where $R_5$ is an alkyl group, preferably a linear alkyl chain, such as $C_8$ to $C_{16}$ alkyl groups; q is an integer value of from 0–3, inclusive.

Examples of such alkylpolyglycoside compounds according to structure VII include: where R is $C_8$ to $C_{10}$ alkyl chains (Glucopon® 220 UP, Glucopon® 225 DK); where R is $C_8$, $C_{10}$, $C_{12}$, $C_{14}$ and $C_{16}$ alkyl chains (Glucopon® 425); where R is $C_{12}$, $C_{14}$ and $C_{16}$ alkyl chains (Glucopon® 600 UP, Glucopon® 625 CSUP, and Glucopon® 625 FE, all of which are available from Henkel Corp., Ambler Pa.). Also useful as the alkylpolyglycoside compound is Triton® CG-110 (Union Carbide Corp.).

Another useful alkylglycoside is GLUCOPON 325N which is described as being a $C_9$–$C_{11}$ alkyl polyglycoside, also commonly referred to as D-glucopyranoside (from Henkel Corp, Ambler Pa.).

Other suitable alkyl polyglycosides that are commercially available include, but are not limited to, GLUCOPON®, or PLANTAREN® surfactants from Henkel Corporation, Ambler, Pa., 19002. Examples of such surfactants include but are not limited to:

1. GLUCOPON® 225 Surfactant—an alkyl polyglycoside in which the alkyl group contains 8 to 10 carbon atoms and having an average degree of polymerization of 1.7.
2. GLUCOPON® 425 Surfactant—an alkyl polyglycoside in which the alkyl group contains 8 to 16 carbon atoms and having an average degree of polymerization of 1.6.
3. GLUCOPON® 625 Surfactant—an alkyl polyglycoside in which the alkyl groups contains 12 to 16 carbon atoms and having an average degree of polymerization of 1.6.
4. APG® 325 Surfactant—an alkyl polyglycoside in which the alkyl groups contains 9 to 11 carbon atoms and having an average degree of polymerization of 1.6.
5. GLUCOPON® 600 Surfactant—an alkyl polyglycoside in which the alkyl groups contains 12 to 16 carbon atoms and having an average degree of polymerization of 1.4.
6. PLANTAREN® 2000 Surfactant—a $C_{8-16}$ alkyl polyglycoside in which the alkyl group contains 8 to 16 carbon atoms and having an average degree of polymerization of 1.4.
7. PLANTAREN® 1300 Surfactant—a $C_{12-16}$ alkyl polyglycoside in which the alkyl groups contains 12 to 16 carbon atoms and having an average degree of polymerization of 1.6.

Other suitable polyols include, but are not limited to, alcohol alkoxylates, fatty alcohol alkoxylates, fatty sorbitan esters and their alkoxylates, and the like. Examples of two commercially available surfactants are the ethylene oxide and propylene oxide surfactants Pluronic® and Tetronic® (obtainable from BASF).

In addition to the compounds described above, the compositions of the present invention optionally may contain auxiliary surfactants, auxiliary antifoam agents and a solvent. Examples of such auxiliary surfactants include, but are not limited to, quaternary ammonium salts, water soluble or water dispersable polymers, or surfactants having the following general formula:

(VIII)

where $R^1$ is a ($C_1$ to $C_6$) alky or ($C_6$ to $C_{14}$) aryl group, G is a carboxyl, sulfonyl, or phosphonyl, M is a charge-balancing cation such as sodium, potassium, or ammonium, and u is an integer of from 1 to 200, preferably an integer of from 2 to 200. When u is an integer of 2 or greater, $G_1$ may be the same or different. An example of such surfactants is Newkalgen® TX-C (obtainable from Takemoto Oil and Fat Co.) which is a phenolic sulfonyl salt.

Optional antifoam agents that may be employed include, but are not limited to, such agents as silicon compounds such as siloxanes with glycols, acetylenics and block alkoxy copolymers.

Concentrations of aromatic alkoxylates and polyols each may range from about 0.1% by weight to about 30% by weight of the compositions. Preferably, aromatic alkoxylates and polyols each may range from about 0.5% by weight to about 15% by weight of the composition. The remainder of the composition includes, but is not limited to, a solvent, auxiliary surfactants or antifoams or mixtures thereof. Auxiliary surfactants may be employed in conventional amounts such as from about 0.001% by weight to about 30% by weight of the composition. Optional antifoam agents may be employed in amounts of from about 0.001% by weight to about 1.0% by weight of the composition. The compositions may contain an alkaline component in the amounts of from about 0.1% to about 15% by weight of the composition, preferably from about 1% to about 10% by weight. Such alkaline components act as developers. The balance of the composition is a solvent. Water is a preferred solvent, however any suitable organic solvent, such as alcohols and ketones and the like, also may be employed.

A preferred composition of the present invention consists essentially of an aromatic alkoxylate in combination with a polyol, an auxiliary surfactant, an antifoam agent and a solvent. A more preferred composition consists of an aromatic alkoxylate in combination with a polyol, an antifoam agent, an alkaline component, and water. Preferably the solvent is water. A most preferred composition consists of a tristyryl alkoxylate, an alkyl glycoside, an antifoam agent, an alkaline component, and water. Preferably, the weight ratio of tristyryl alkoxylate to the alkyl glycoside in the composition is from about 1:1 to about 3:1 respectively, most preferably about 1:1.

Surprisingly, the compositions of the present invention reduce or prevent residue and scum from both positive-working (both liquid and dry film) and negative-working photoresist (both liquid and dry film). Such residue and scum on a substrate are difficult to remove with many cleaners because of the types of chemicals used in photoresists, in particular the new generation of photoresists which contain many compounds of a hydrophobic aromatic character.

Additionally, the compositions of the present invention also reduce or prevent formation of residues on a substrate deposited by secondary photoresists. Such photoresist may be employed in soldermasks. Residue and scum are deposited on a substate as a result of component separation in the soldermask. Such component separation may be exacerbated when an improperly balanced soldermask developer solution, i.e. improper developing conditions and/or soldermask developer solution chemistry, contact the soldermask. Residue and scum build-up on such substrates as printed wiring boards and soldermask developer apparatus. Built-up residue and scum may appear as a bright green coating on developer apparatus surfaces. The bright green coating comes from an oily layer of water insoluble material from the secondary photoresists in which pigment from the photoresists concentrate. Generally, there is a higher level of hydrophobic aromatic compounds in secondary photoresist formulations than primary photoresist formulations. Thus reducing or preventing residue and scum deposited by secondary photoresists is a further improvement of the compositions of the present invention.

Residues and scum from photoresist include, but are not limited to, such chemical materials as hydrophobic aromatic materials such as photoinitiators, thermoinitiators, dyes, acrylic, and methacrylic monomers. Photoinitiators such as photoacid generators, photobase generators or free-radical generators once built-up as residue or scum on a substrate are more difficult to remove, i.e., clean, than many of the other components that compose the residue and scum. Such materials do not readily re-emulsify, i.e., clean, once they build-up on a substrate such as photolithographic manufacturing apparatus.

Photoresists vary in composition. Generally, a photoresist composition may compose from about 20% to about 90% by weight of a binder polymer, about 15% to about 50% by weight of α,β-ethylenically unsaturated compounds (cross-linkers) such as monomers and short-chain oligomers and from about 0.1% to about 25% by weight of a photoinitiator or photoinitiator chemical system, preferably from about 5% to about 15% by weight. Liquid photoresists may contain a larger concentration of monomers or short-chain oligomers in relation to polymer binders whereas dry film may contain larger concentrations of polymer binders. Such concentrations are known in the art. Other components employed in a photoresist that may contribute to residue and scum build-up are discussed below. Built-up residue and scum from liquid photoresist appears as crystalline material on a substrate.

Examples of components that compose a photoresist that may cause undesirable built-up residue or scum on a substrate include, but are not limited to, polymeric binders such as those containing as polymerized units one or more ethylenically or acetylenically unsaturated monomers. Examples of monomers include, but are not limited to: (meth)acrylic acid, (meth)acrylamides, alkyl (meth) acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like. Preferred monomers include (meth)acrylic acid, alkyl (meth) acrylates and vinyl aromatic monomers. Such polymeric binders may be homopolymers or copolymers and preferably copolymers.

Cross-linkers that may cause residue or scum build-up include di-, tri-, tetra-, or higher multi-functional ethylenically unsaturated monomers. Examples of such cross-linkers include, but are not limited to: trivinylbenzene, divinyltoluene, divinylpyridine, divinylnaphthalene and divinylxylene; and such as ethyleneglycol diacrylate, trimethylolpropane triacrylate ("TMPTA"), diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, ethoxylated diacrylates, ethoxylated triacrylates such as ethoxylated TMPTA and ethoxylated TMPTMA, ethoxylated tetraacrylates, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane), glycosyl ureas including di-, tri- and tetra-glycosyl ureas, epoxies and mixtures thereof. Such cross-linking agents are generally commercially available.

Photoimageable compositions contain one or more photoactive components. The photoactive components may be photoacid generators, photobase generators or free-radical generators. Such photoactive components are a major source of scum formations.

Example of photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl) hydrazines and the like.

Free-radical generators include, but are not limited to, n-phenylglycine, aromatic ketones such as benzophenone, N,N"-tetramethyl-4,4'-diaminobenzophenone [Michler's ketone], N,N'-tetraethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer, and the like. Though, not a free-radical generator, triphenylphosphine may be included in the photoactive chemical system as a catalyst.

Optional additives that may be used in photoimageable compositions and that cause residue and scum include, but are not limited to: anti-striation agents, plasticizers, speed enhancers, fillers, dyes, film forming agents, non-polymerizable organic acids and the like. Suitable plasticizers include esters such as dibenzoate esters. Non-polymerizable organic acids may also be added to photoresist compositions. Such organic acids are substantially non-polymerizable with the polymeric binders, optional cross-linking agents or both. A wide variety of organic acids may suitably be added to photoresist compositions. Suitable organic acids include, but are not limited to, alkanecarboxylic acids and arylcarboxylic acids, sulfonic acids such as alkanesulfonic acids and arylsulfonic acids, phosphonic acids such as alkylphosphonic acids and arylphosphonic acids, and the like. Exemplary carboxylic acids include, but are not limited to, $(C_1-C_{12})$ alkylcarboxylic acids, $(C_1-C_{12})$alkyldicarboxylic acids, $(C_1-C_{12})$alkyltricarboxylic acids, substituted $(C_1-C_{12})$ alkylcarboxylic acids, substituted $(C_1-C_{12})$ alkyldicarboxylic acids, substituted $(C_1-C_{12})$ alkyltricarboxylic acids, amine carboxylic acids such as ethylenediamine tetraacetic acid, arylcarboxylic acids such as arylmonocarboxylic acids, aryldicarboxylic acids and aryltricarboxylic acids, and substituted arylcarboxylic acids. Preferred organic acids include formic acid, acetic acid, propionic acid, oxalic acid, malonic acid, succinic acid, glutaric acid, adipic acid, glycolic acid, lactic acid, tartaric acid, citric acid or malic acid, ethylenediamine tetraacetic acid, phthalic acid, benzene tricarboxylic acid, salicilic acid, cyclohexanecarboxylic acid, 1,4-cyclohexanedicarboxylic acid and sebacic acid.

A wide variety of photoresist strip enhancers also may be used in photoresists. Such strip enhancers may contribute to residue and scum build-up. Examples of photoresist strip enhancers are compounds containing one or more trihalomethyl-substituents in an alpha position relative to a group capable of stabilizing a negative charge.

Aromatic alkoxylates in combination with polyols may be added to developer solutions in sufficient amounts to reduce or prevent residue and scum formation during photoresist development. Alkaline aqueous developer solution may be a solution of sodium carbonate, e.g., about 1% sodium carbonate monohydrate. Other bases, such as NaOH, KOH, triethanolamine, sodium metasilicate, potassium carbonate, and the like may be used to provide the alkalinity necessary for developing photoresists. The alkalinity of the developing solution forms salts with the acid functionality of the binder polymer, typically carboxylic acid functionality, rendering the binder polymer soluble in the alkaline aqueous solution. Alkalinity of developer solutions range from a pH of from about 8.0 to about 14.0, preferably from about 10.0 to about 12.0.

The residue and scum reducing compositions of the present invention are highly suitable in printed wiring board manufacturing methods. Using a method for forming a printed circuit board for purposes of exemplification, a photoimageable composition may be applied to a substrate having a pattern of conductive material disposed thereon. The substrate may be a copper laminate substrate prepared by known methods in the art, or any other suitable metal laminate. Other suitable substrates include those prepared by laminating multilayer boards for the manufacture of printed circuit boards with vias (through-holes) and interconnections which may contain solder.

The photoimageable composition may be coated onto the substrate using conventional techniques. The coating may be deposited so as to yield a film thickness of at least about 0.50 mil. After coating, the film formed may be dried to remove solvent using a suitable method known in the art.

A process of transferring an image to the coating involves exposing the coating to a source of patterned activating radiation to initiate the photoreaction in exposed areas. Suitable sources of activating radiation include actinic radiation, x-rays, etc. Following exposure, the layer is subjected to a low temperature bake to initiate crosslinking of the exposed portions of the binder by the liberation of the photogenerated catalyst. The bake conditions comprise heating to a temperature capable of initiating the curing reaction but the temperature should be below that temperature where thermal crosslinking would occur in unexposed areas of the film. Bake temperatures may vary from about 85° to about 120° C.

Areas not exposed to activating radiation are readily dissolved by aqueous alkali solutions if a negative-working photoresist is used. Positive-working photoresist works opposite to that of negative-working photoresists. An example of a developer is a metal hydroxide with concentrations between about 0.5 to about 5% of alkaline hydroxide or an alkali metal carbonate in water. A typical development time is 30 to 60 seconds. Residue and scum reducing compositions of the present invention are added to the developer prior to developing in a sufficient amount to reduce or prevent residue and scum formation and reduce or prevent foam formation. Developer solutions are maintained at pH ranges of from about 8.0 to about 14.0, preferably about 10.0 to about 12.0 during development. After development of the image, the remainder of the photoresist coating is characterized by a partial cure whereby most of the binder components are crosslinked. A second cure may be desirable to achieve full thermal and electrical solder mask properties.

Advantageously, the residue and scum reducing compositions and methods of the present invention provide for a means of reducing or preventing the formation of residue and scum deposited by photolithographic compositions on substrates or in solutions such as developer solutions. Thus cleaning the residue and scum from substrates such as printed wiring boards or developer apparatus is made easier or eliminated. In addition to reducing residue and scum formation, the compositions and methods of the present invention also reduce or prevent foam formation during developing processes. Foam formation, especially excessive foam formation, can result in defects in the manufacturing of printed wiring boards. Foam formation obstructs the view of a worker's filed of vision during manufacturing processes which in turn can lead to defects in printed wiring boards. Additionally, foam is difficult to clean from manufacturing apparatus. Cleaning away the foam with water usually aggravates foam formation, and many antifoam agents deposit residues which are difficult to clean. The present invention provides for a more efficient manufacturing process since less time is involved in cleaning equipment, and less waste is generated thus providing for a more environmentally friendly cleaning composition and method.

Another advantage of the present invention is the synergistic action of the combination of an aromatic alkoxylate with a polyol. The combination of the aromatic alkoxylate with the polyol provides for at least a two fold efficiency in preventing residue and scum formation over the individual components of the residue and scum reducing compositions. Combinations of aromatic alkoxylates in combination with polyols may have efficiencies of as high as eight fold to as high as ten fold. Accordingly, the compositions and methods of the present invention are an improvement in the manufacturing of printed wiring boards.

In addition to reducing residue and scum formation, the aromatic alkoxylate and polyol compositions of the present invention make cleaning of substrates with cleaners easier. Residue and scum are more readily re-emulsified by cleaners. While the aromatic alkoxylate and polyol compositions reduce residue and scum formation, to further minimize residue and scum build-up, substrates such as developer apparatus may be cleaned on a regular schedule to further reduce the build-up of residue and scum formation. Such schedules may be weekly, biweekly or monthly. Thus, the method of the present invention reduces equipment maintenance and the cost of waste treatment.

While the present invention is described in the context of cleaning organic residue and scum deposited by photolithographic compositions, the compositions of the present invention may be employed to reduce or prevent formation of organic residue and organic scum on any substrate or in solutions in general.

The following Examples are intended to further illustrate the present invention but are not intended to limit the scope of the invention.

EXAMPLE 1

Scum Reduction Test

Modified gas washing bottles were provided for each experiment with about 200 ml of an alkaline developer solution (diluted, per standard practice, to 10.0 gm/liter of total sodium carbonate) with about 3.53 gm of dry film photoresist dissolved (about 23 mil*sqft/gal). Additives added to each bottle are disclosed in the table below. Total emulsifier concentration in each bottle was about 2000 ppm (part per million). Each solution was bubbled for about 5 hours with air through a submerged glass frit at about 1000 cc/min. Each aerated solution was allowed to stand overnight and then was filtered through a weighed 3μPTFE (polyethylene terephthalate) membrane filter to retrieve any scum formed overnight. The filter with the scum was dried in a conventional oven, and reweighed. The data illustrated that the residue and scum reducing activity of the combinations within the scope of the invention reduced residue formation in contrast to the control samples. The amount of scum is in grams. The control samples did not contain any emulsifiers but just alkaline developer, antifoam agents and dry film photoresist. Antifoam PI-53® is a mixture of glycols and siloxanes, and antifoam DF-66® is an acetylenic.

Based on the data that was collected in the table below, the control samples had an average scum generation of 38.9 grams (gms). Soprophor® BSU in combination with Glucopon® 425N had an average scum generation of 24.6 gms. Soprophor® BSU had an average scum generation value of 36.4 gms. The combination of Soprophor® BSU and Glucopon® 425N had a reduced scum reduction lower than that of Soprophor® BSU by itself when the weight ratio of the Soprophor® BSU to Glucopon® 425N was 1:1

(compositions 13 and 14) and when the weight ratio was 3:1 (composition 19 and 20). Overall best results were obtained from the mixtures of Soprophor® BSU with Tween 80 (ethoxylated sorbitan fatty acid ester) and Tetronic® 90R4 (alkoxylated block components) with an average scum generation of 14.1 gms. Accordingly, the compositions within the scope of the present invention reduced scum formation.

ate developer and dissolved dry film photoresist. The blends were added to separate graduate cylinders in concentrations of 3, 6 and 9 ml/gallon. Air was bubbled through the solution over a period of about 10 minutes, and foam heights were measured in milliliters (ml) at 1, 2, 4 and 10 minute intervals for all of the samples. The data showed that compositions Soprophor® BSU, Glucopon® 425N and the mixture of Influence of Antifoams on Scum Generation of a Dry Film Photoresist

| Composition | Emulsifer 1 | Emulsifier 2 | Emulsifier 3 | Ratio | Antifoam | AF Loading | Scum |
|---|---|---|---|---|---|---|---|
| 1 | Soprophor ® BSU | | | 100% | PI-53 | 250 ppm | 29.3 |
| 2 | Soprophor ® BSU | | | 100% | PI-53 | 500 ppm | 43.5 |
| 3 | (none) | | | | PI-53 | 250 ppm | 37.7 |
| 4 | (none) | | | | PI-53 | 500 ppm | 57.3 |
| 5 | Soprophor ® BSU | Glucopon ® 425N | | 1/1 | PI-53 | 250 ppm | 31.8 |
| 6 | Soprophor ® BSU | Glucopon ® 425N | | 1/1 | PI-53 | 500 ppm | 57.8 |
| 7 | (none) | | | | PI-53 | 250 ppm | 43.4 |
| 8 | (none) | | | | PI-53 | 500 ppm | 60.2 |
| 9 | Soprophor ® BSU | Glucopon ® 425N | | 3/2 | PI-53 | 125 ppm | 23.6 |
| 10 | Soprophor ® BSU | Glucopon ® 425N | | 3/2 | PI-53 | 250 ppm | 40.2 |
| 11 | Soprophor ® BSU | Tween ® 80 | Tetronic ® 90R4 | 33/17/50 | PI-53 | 125 ppm | 10.9 |
| 12 | Soprophor ® BSU | Tween ® 80 | Tetronic ® 90R4 | 33/17/50 | PI-53 | 250 ppm | 10 |
| 13 | Soprophor ® BSU | Glucopon ® 425N | | 1/1 | PI-53 | 125 ppm | 13.5 |
| 14 | Soprophor ® BSU | Glucopon ® 425N | | 1/1 | PI-53 | 250 ppm | 16.3 |
| 15 | (none) | | | | PI-53 | 125 ppm | 24 |
| 16 | (none) | | | | PI-53 | 250 ppm | 26.1 |
| 17 | Soprophor ® BSU | Glucopon ® 425N | | 2/1 | PI-53 | 125 ppm | 33.7 |
| 18 | Soprophor ® BSU | Glucopon ® 425N | | 2/1 | PI-53 | 250 ppm | 18 |
| 19 | Soprophor ® BSU | Glucopon ® 425N | | 3/1 | PI-53 | 125 ppm | 16.6 |
| 20 | Soprophor ® BSU | Glucopon ® 425N | | 3/1 | PI-53 | 250 ppm | 26.7 |
| 21 | Soprophor ® BSU | Tween ® 80 | Tetronic ® 90R4 | 33/33/33 | PI-53 | 125 ppm | 17.9 |
| 22 | Soprophor ® BSU | Tween ® 80 | Tetronic ® 90R4 | 33/33/33 | PI-53 | 250 ppm | 17.5 |
| 23 | (none) | | | | PI-53 | 125 ppm | 19.3 |
| 24 | (none) | | | | PI-53 | 250 ppm | 43 |

EXAMPLE 2

Effectiveness of Surfactant and Mixture of Siloxane with Glycols at Various Levels of Use
Test run in alkaline developer at 10.0 gms total carbonate per liter in deionized water
Solution loaded with dry film photoresist at 23 mil*sqft/gal

| Addition (ml/gal) | Foam Rise (ml in 250 ml cylinder) | | | |
|---|---|---|---|---|
| | 1 minutes | 2 minutes | 4 minutes | 10 minutes |
| 0 | 228 | 212 | 194 | 188 |
| 3 | 126 | 116 | 134 | 150 |
| 6 | 112 | 112 | 116 | 130 |
| 9 | 98 | 100 | 106 | 120 |

| Addition (ml/gal) | scum (mgs) |
|---|---|
| 0 | 48.8 |
| 3 | 33.3 |
| 6 | 34.6 |
| 9 | 31.9 |

| Emulsifier and Antifoam Blend (parts by weight) | |
|---|---|
| Soprophor ® BSU | 40 |
| Glucopon ® 425N | 40 |
| Antifoam Agent (mixtures of glycols and siloxanes) | 20 |

Four test samples were prepared containing mixtures of the above-identified emulsifiers and antifoam agent to test foam inhibition of compositions of the present invention. Four additional graduate cylinders were used to test scum formation overnight. The control contained sodium carbonate siloxane with glycols reduced foam in contrast to a composition without the blends. In addition, the composition with the additives reduced scum formation. The control formed 48.8 mgs of scum while the blends formed 33.3 mgs, 34.6 mgs and 31.9 mgs of scum. Thus the compositions of the present invention reduced both foam generation and scum formation. The antifoam agents appeared compatible with the emulsifiers.

What is claimed:

1. A composition comprising one or more tristyrylphenol alkoxylates in combination with one or more alkyl glycosides in sufficient amounts to reduce or prevent residue and scum formation on a substrate or in a solution.

2. The composition of claim 1, further comprising one or more auxiliary surfactants.

3. The composition of claim 1, further comprising one or more antifoam agents.

4. The composition of claim 1, wherein the tristyrylphenol alkoxylates are chosen from tristyrylphenol ethoxylates and salts thereof, tristyrylphenol ethoxylate/propoxylates and salts thereof and mixtures thereof.

5. The composition of claim 1, further comprising an alkaline component.

6. A composition consisting of one or more tristyrylphenol alkoxylates, one or more alkyl glycosides, one or more auxiliary surfactants, one or more antifoam agents, one or more alkaline components, and water.

7. The composition of claim 6, wherein the tristyrylphenol alkoxylates are chosen from tristyrylphenol ethoxylates and salts thereof, tristyrylphenol ethoxylates/propoxylates and salts thereof, and mixtures thereof.

8. A method comprising contacting a substrate or solution containing photolithographic material with a composition comprising one or more tristyrylphenol alkoxylates in combination with one or more alkyl glycosides in sufficient amounts to reduce or prevent residue and foam formation.

9. The method of claim 8, wherein the solution is a developer solution.

10. The method of claim 8, wherein the substrate is a printed wiring board.

* * * * *